(12) United States Patent
Okabe

(10) Patent No.: US 11,170,828 B2
(45) Date of Patent: Nov. 9, 2021

(54) VOLTAGE GENERATING CIRCUIT, SEMICONDUCTOR STORAGE DEVICE AND BIT LINE CHARGING METHOD THEREOF

(71) Applicant: Winbond Electronics Corp., Taichung (TW)

(72) Inventor: Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/882,754

(22) Filed: May 26, 2020

(65) Prior Publication Data
US 2020/0395054 A1 Dec. 17, 2020

(30) Foreign Application Priority Data
Jun. 17, 2019 (JP) ............................... JP2019-111694

(51) Int. Cl.
*G11C 5/14* (2006.01)
*G11C 7/12* (2006.01)

(52) U.S. Cl.
CPC ............... *G11C 7/12* (2013.01); *G11C 5/147* (2013.01)

(58) Field of Classification Search
CPC .......... G11C 7/12; G11C 5/147; G11C 16/30; G11C 7/18; G11C 16/24; G11C 7/02; G11C 16/26

(Continued)

(56) References Cited

U.S. PATENT DOCUMENTS 6,075,733 A 6/2000 Brown
6,477,090 B2 * 11/2002 Yamaki ............... G11C 29/021
365/189.09

(Continued)

FOREIGN PATENT DOCUMENTS

CN 102789802 11/2012
JP 2011176177 9/2011

(Continued)

OTHER PUBLICATIONS

"Office Action of Korea Counterpart Application" with English translation thereof, dated May 20, 2021, p. 1-p. 10.

(Continued)

*Primary Examiner* — Tha-O H Bui
(74) *Attorney, Agent, or Firm* — JCIPRNET

(57) ABSTRACT

A voltage generating circuit, a semiconductor storage device, and a bit line charging method thereof are provided. The voltage generating circuit includes: an INTVDD generating circuit for generating an internal power supply voltage INTVDD from an external power supply voltage EXVDD; a VDD_V1 generating circuit for generating an internal power supply voltage VDD_V1 from the external power supply voltage EXVDD; and a V1_driving circuit generating a charging voltage for charging the bit line at an output node by using the internal power supply voltage VDD_V1. The V1_driving circuit may generate voltages V1 having different driving capability. The V1_driving circuit charges the bit line with the voltage V1 having a weak driving capability during a first charging period of the bit line and charges the bit line with the voltage V1 having a strong driving capability during a second charging period.

13 Claims, 5 Drawing Sheets

(58) Field of Classification Search
USPC .......................................................... 365/226
See application file for complete search history.

(56) References Cited

U.S. PATENT DOCUMENTS

| | | |
|---|---|---|
| 6,950,346 B2 | 9/2005 | You |
| 7,251,184 B2 | 7/2007 | Nakaya et al. |
| 7,480,183 B2 | 1/2009 | Mori |
| 7,643,347 B2 | 1/2010 | Abiko et al. |
| 8,159,884 B2 | 4/2012 | Honda |
| 2001/0014002 A1* | 8/2001 | Hidaka .................... G11C 7/06 |
| | | 361/227 |

FOREIGN PATENT DOCUMENTS

| | | |
|---|---|---|
| JP | 5631436 | 11/2014 |
| KR | 20180022566 | 3/2018 |
| TW | 201824262 | 7/2018 |

OTHER PUBLICATIONS

"Office Action of Taiwan Counterpart Application", dated Jun. 18, 2021, p. 1-p. 7.

* cited by examiner

VOLTAGE GENERATING CIRCUIT, SEMICONDUCTOR STORAGE DEVICE AND BIT LINE CHARGING METHOD THEREOF

CROSS-REFERENCE TO RELATED APPLICATION

This application claims the priority benefit of Japan application serial no. 2019-111694, filed on Jun. 17, 2019. The entirety of the above-mentioned patent application is hereby incorporated by reference herein and made a part of this specification.

BACKGROUND

Technical Field

The disclosure relates to a semiconductor storage device such as a flash memory, etc., and particularly relates to suppression of a peak current during operation.

Description of Related Art

In a reading operation of a NAND flash memory, pages including even-numbered bit lines or pages including odd-numbered bit lines are alternately read. During a process of reading the even-numbered pages, the odd-numbered pages are cut off from a sense amplifier and a shield potential is supplied thereto, and during a process of reading the odd-numbered pages, the even-numbered pages are cut off from the sense amplifier, and the shield potential is supplied thereto, thereby reducing noises caused by capacitive coupling between adjacent bit lines (patent literature 1). Moreover, during page reading, the bit line is pre-charged, and the bit line is discharged corresponding to a storage state of a selected memory cell, and then a potential of the bit line is read, but if a bit line capacitance is increased along with increase of a page number, a time required to charge and discharge the bit line becomes longer. Therefore, it is disclosed that a pre-charging circuit is arranged between blocks to shorten a pre-charging time of the bit lines (patent literature 2).

Patent literature 1: Japan Patent No. 11-176177
Patent literature 2: Japan Patent No. 5631436

SUMMARY

FIG. 1 is a diagram illustrating a structure of a part of a page buffer/readout circuit shared by even bit lines and odd bit lines and a bit line selection circuit. The page buffer/readout circuit includes: an N-type metal oxide semiconductor (NMOS) transistor BLPRE connected between a voltage V1 and a readout node SNS for pre-charging a bit line; an NMOS transistor BLCLAMP configured to clamp a voltage of the bit line; and an NMOS transistor BLCN configured to be connected to the bit line selection circuit. The transistor BLCLAMP and the transistor BLCN are connected through a node TOBL. The transistor BLPRE and the transistor BLCLAMP respectively have gate lengths of Lg=0.3 μm, and are driven by a low voltage. In addition, the page buffer/readout circuit further includes a latch circuit (not shown) connected to the readout node SNS.

The bit line selection circuit includes: a transistor BLSe used for selecting an even-numbered bit line GBLe, a transistor BLSo used for selecting an odd-numbered bit line GBLo, a transistor YBLe used for connecting a virtual power supply VIRPWR and the even-numbered bit line GBLe, and a transistor YBLo used for connecting the virtual power supply VIRPWR and the odd-numbered bit line GBLo. These transistors are NMOS transistors driven by high voltages. For example, in a readout operation, when the even-numbered bit line GBLe is selected, the transistor YBLe is turned off, the transistor YBLo is turned on, and 0 V is supplied from the virtual power supply VIRPWR to the odd-numbered bit line GBLo, and when the odd-numbered bit line GBLo is selected, the transistor YBLe is turned on, the transistor YBLo is turned off, and 0 V is supplied from the virtual power supply VIRPWR to the even-numbered bit line GBLe to perform readout shielding. In a programming operation, a bias voltage is applied from the virtual power supply VIRPWR to a non-selected bit line, and floating-gate (FG) coupling between memory cells is suppressed.

Referring to FIG. 4, FIG. 4 is a diagram illustrating a layout example of a driving circuit disposed around the page buffer/readout circuit. As shown in FIG. 4, a V1_driving circuit V1_DRV used for generating the voltage V1 or a driving circuit VIRPWR_DRV of the virtual power supply VIRPWR is disposed around the page buffer PB together with other driving circuits 20 due to a collector resistor (RC) load of wiring, etc. In other words, the V1_driving circuit V1_DRV, the driving circuit VIRPWR_DRV, and the other driving circuits 20 cannot be disposed away from the page buffer PB.

FIG. 2 illustrates a structure of the V1_driving circuit V1_DRV. The V1_driving circuit V1_DRV generates the voltage V1 by using an external power supply voltage EXVDD (for example, 3.3 V) supplied from the outside and an internal power supply voltage INTVDD (for example, 1.8 V). The driving circuit includes inverters IN1-IN3 and transistors Q1-Q3. The transistors Q1-Q2 are pull-up transistors, and the transistor Q3 is a pull-down transistor. The transistor Q1 is connected between the external power supply voltage EXVDD and an output node N1, the transistor Q2 is connected between the internal power supply voltage INTVDD and the output node N1, and the transistor Q3 is connected between the output node N1 and a ground terminal GND. Gate lengths of the transistor Q1 and the inverter IN1 (Lg=0.5 μm) are greater than gate lengths of other transistors (Lg=0 μm) due to a withstand voltage generated by high voltage driving. Moreover, a driving signal with a level shifted by a level shifter LS is supplied to the inverter IN1.

When the transistor Q1 is turned on, the transistor Q2 and the transistor Q3 are turned off, and the voltage V1 with a level (3.3 V) of the external power supply voltage EXVDD is generated at the output node N1. When the transistor Q2 is turned on, the transistor Q1 and the transistor Q3 are turned off, and the voltage V1 with a level (1.8 V) of the internal power supply voltage INTVDD is generated at the output node N1. When the transistor Q3 is turned on, the transistor Q1 and the transistor Q2 are turned off, and the output node N1 is at the GND level. In addition, although not illustrated, the driving circuit VIRPWR_DRV for the virtual power supply VIRPWR is similar to the V1_driving circuit V1_DRV shown in FIG. 2 in structure.

FIG. 3 illustrates a structure of a regulator that generates the internal power supply voltage INTVDD. As shown in FIG. 3, a regulator 10 includes: a transistor Q4 connected between the external power supply voltage EXVDD and an output node N2; a resistor divider connected between the output node N2 and GND; and an operational amplifier (differential amplifier) OPamp, which compares a voltage of a node N3 divided by the resistor divider with a reference voltage Vref, controls the transistor Q4 according to a comparison result, and outputs the internal power supply voltage INTVDD of 1.8 V obtained by stepping down the external power supply voltage EXVDD from the output node N2. Herein, the transistor Q4 is a PMOS transistor. The internal power supply voltage INTVDD is not only used by the V1_driving circuit V1-DRV or the driving circuit VIRPWR_DRV of the virtual power supply VIRPWR, but is also used by logic circuits or other circuits.

FIG. 5 illustrates a relationship between waveforms of a charging voltage SNS_INTVDD appeared at the readout node SNS and a clamp voltage VCLMP appeared at the node TOBL and the V1_driving circuit when a bit line is charged. When the bit line is charged, the transistor BLPRE, the transistor BLCLAMP, and the transistor BLCN are turned on, and the voltage V1 is supplied to the selected bit line. As shown in FIG. 2, the V1_driving circuit V1_DRV includes a voltage supply path of the external power supply voltage EXVDD and a voltage supply path of the internal power supply voltage INVDD and charges the bit line through the power supply path of the external power supply voltage EXVDD during a period t1 when the bit line is initially charged. The readout node SNS is charged by the voltage V1 of the external power supply voltage EXVDD, and the clamp voltage VCLMP generated by clamping a gate voltage of the transistor VCLAMP is appeared at the node TOBL. In a subsequent charging period t2, the bit line is charged via the voltage supply path of the internal power supply voltage INTVDD. Since the transistor BLPRE and the transistor BLCLAMP are withstand voltages operated by the internal power supply voltage, switching of the voltage supply path from the external power supply voltage EXVDD to the internal power supply voltage INTVDD must be performed before the charging voltage SNS_INTVDD appeared at the readout node SNS reaches the internal power supply voltage INTVDD. Therefore, the V1_driving circuit must be adjusted according to a change of process/voltage/temperature (PVT).

However, if the adjustment is made by using the earliest condition of the charging period t1 of the external power supply voltage EXVDD, when the adjustment is applied to a device using the latest condition of the charging period t1 of the external power supply voltage EXVDD, at a point in time when the internal power supply voltage INTVDD is switched, a voltage level of the bit line becomes excessively low, which causes a large voltage drop of the internal power supply voltage INTVDD. Since the internal power supply voltage INTVDD is used for entire circuit control, the voltage drop of the internal power supply voltage INTVDD should be avoided as much as possible.

In order to avoid the above situation, a method of using two internal power supply voltages is provided, the two internal power supply voltages are respectively a dedicated internal power supply voltage only used for the voltage V1 and an internal power supply voltage used in other logic circuits, etc. The V1_driving circuit V1_DRV shown in FIG. 6 includes the voltage supply path of the external power supply voltage EXVDD and a voltage supply path of an internal power supply voltage VDD_V1 dedicated to the voltage V1. The other circuit structure is the same as the V1_driving circuit V1_DRV in FIG. 2.

FIG. 7A illustrates a regulator 30 that generates the internal power supply voltage INTVDD. FIG. 7B illustrates a regulator 40 that generates the internal power supply voltage VDD_V1. The regulator 30 and the regulator 40 are similar to the regulator 10 shown in FIG. 3 in structure. The difference is only that the internal power supply voltage INTVDD generated by the regulator 30 is used for logic circuits or other circuits, and the internal power supply voltage VDD_V1 generated by the regulator 40 is only used for the V1_driving circuit V1_DRV shown in FIG. 6.

In this way, through the internal power supply voltage VDD_V1 dedicated to the V1_driving circuit V1_DRV, even a voltage drop of the internal power supply voltage VDD_V1 as described in FIG. 5 is generated during the charging of the bit line, since the internal power supply voltage INTVDD is independent of the internal power supply voltage VDD_V1, an influence of the voltage drop of the internal power supply voltage VDD_V1 on the internal power supply voltage INTVDD is limited. Furthermore, in the case of the above method, there is no circuit added to the V1_driving circuit V1_DRV or the driving circuit VIRPWR_DRV of the virtual power supply VIRPWR. In other words, the regulator 40 of the internal power supply voltage VDD_V1 (the regulator used in the driving circuit of the virtual power supply VIRPWR is the same) may be disposed separately from the page buffer PB. Therefore, an area around the page buffer PB is not increased.

However, the V1_driving circuit V1_DRV (and the driving circuit VIRPWR_DRV of the virtual power supply VIRPWR) still has the voltage supply path of the external power supply voltage EXVDD, and the V1_driving circuit V1_DRV and the driving circuit VIRPWR_DRV of the virtual power supply VIRPWR are arranged around the page buffer PB, and the voltage supply path of the external power supply voltage EXVDD increases an occupation area around the page buffer PB. Particularly, if data or address scrambling scheme or a continuous readout scheme is implemented, the number of the driving circuits is increased. As such, it is ideal to minimize the V1_driving circuit V1_DRV and the driving circuit VIRPWR_DRV of the virtual power supply VIRPWR as much as possible.

An object of the disclosure is to solve the above problems and provide a voltage generating circuit and a semiconductor storage device capable of reducing a circuit area while ameliorating power efficiency and suppressing a peak current.

The disclosure provides a voltage generating circuit including a first circuit generating a first internal power supply voltage by using an external power supply voltage and a second circuit generating a charging voltage at an output node for charging a bit line by using the first internal power supply voltage. The second circuit includes a first generating circuit generating a charging voltage having a first driving capability, a second generating circuit generating a charging voltage having a second driving capability greater than the first driving capability, and a control component, controlling the charging voltages generated by the first generating circuit and the second generating circuit.

The disclosure provides a method for charging a bit line of a semiconductor storage device, and the method includes the following step. An internal power supply voltage only used for charging the bit line from an external power supply voltage is generated. The bit line is charged by using a charging voltage having a first driving capability generated from the internal power supply voltage during a first charging period of the bit line. The bit line is charged by using a charging voltage having a second driving capability greater than the first driving capability generated from the internal power supply voltage during a second charging period of the bit line.

According to the above description, the disclosure generates the charging voltages for charging the bit line from the first internal power supply voltage generated by using the external power supply voltage and selectively uses the charging voltage having the first driving capability and the charging voltage having the driving capability greater than the first driving capability to charge the bit line. In this way, compared to the prior art, the power efficiency and the peak current generated when charging the bit line are ameliorated, and a circuit area used for charging the bit line is reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Generally, a NAND flash memory uses the driving circuit of the voltage V1/the driving circuit of the virtual power supply VIRPWR when applying a voltage to a bit line. In the existing flash memory, in order to reduce a peak current, the external power supply voltage EXVDD is used when charging the bit line. Namely, after using the external power supply voltage EXVDD to charge the bit line during a fixed period, the external power supply voltage EXVDD is switched to the internal power supply voltage INTVDD for charging.

Figure 6:
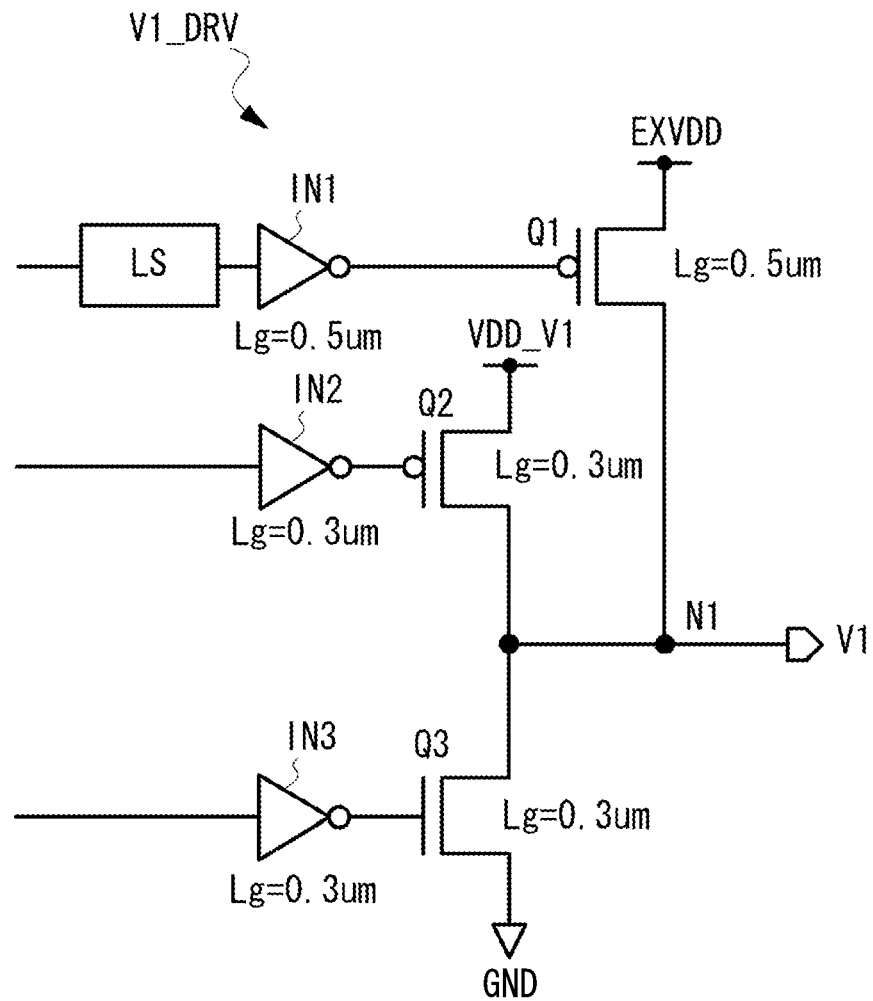
FIG. 6 is a diagram illustrating a structure of a V1_driving circuit according to another existing method.

Since the existing driving circuit of the voltage V1/the driving circuit of the virtual power supply VIRPWR (as shown in FIG. 6) uses the external power supply voltage EXVDD, components such as a level shifter LS, a low voltage P-type metal oxide semiconductor (low voltage PMOS, LVP)/low voltage N-type metal oxide semiconductor (low voltage NMOS, LVN) transistor with a gate length Lg=0.5 μm are required. Therefore, in order to protect the driving circuit of the voltage V1/the driving circuit of the virtual power supply VIRPWR or a breakdown voltage of the page buffer, attention must be paid to a design and control of the circuit. Therefore, there is a problem in flexibility or the area around the page buffer.

The disclosure provides a novel driving circuit of the voltage V1/driving circuit of the virtual power supply VIRPWR. The driving circuit generates the voltage V1/the virtual power VIRPWR only through the internal power supply voltage VDD_V1 different from the internal power supply voltage INTVDD, so that the influence on the internal power supply voltage INTVDD may be suppressed. Secondly, since the external power supply voltage EXVDD is not used, it is unnecessary to use a transistor and a shifter driven by a high voltage, which may reduce a layout area and reduce the cost. In addition, the driving circuit has a driving control component that may switch the voltage V1/the virtual power supply VIRPW of different driving capabilities, and in case of charging the bit line, the voltage having a weak driving capability is first used for charging, and then the voltage having a strong driving capability is switched for charging, which may effectively suppress the peak current.

Figure 8:
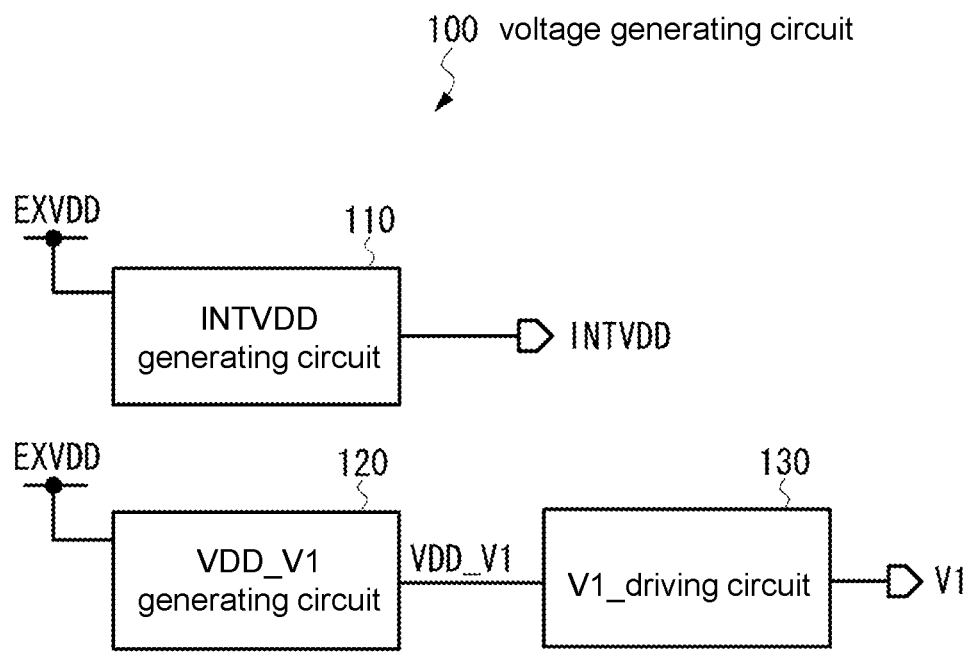
FIG. 8 is a block diagram illustrating a structure of a voltage generating circuit according to an embodiment of the disclosure.

Next, the embodiment of the disclosure is described in detail below with reference to the drawings. FIG. 8 is a diagram illustrating a structure of a voltage generating circuit according to an embodiment of the disclosure. A voltage generating circuit 100 of the embodiment is mounted on a NAND flash memory, and may be used as a circuit for charging a bit line during a reading operation or a programming operation.

The voltage generating circuit 100 includes the following components: an INTVDD generating circuit 110 that generates the internal power supply voltage INTVDD by using the external power supply voltage EXVDD supplied from external, a VDD_V1 generating circuit 120 that generates the internal power supply voltage VDD_V1 by using the external power supply voltage EXVDD, and a V1_driving circuit 130 that generates the voltage V1 for charging the bit line by using the internal power supply voltage VDD_V1. The external power supply voltage EXVDD is, for example, 3.3 V, and the internal power supply voltage INTVDD and the internal power supply voltage VDD_V1 are 1.8 V.

Figure 7A:
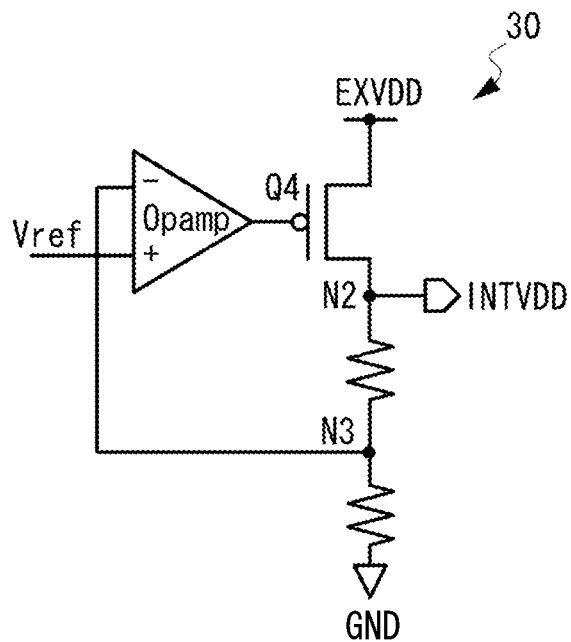
FIG. 7A and FIG. 7B are diagrams illustrating an example of dividing an internal power supply voltage into two according to another existing method.
Figure 7B:
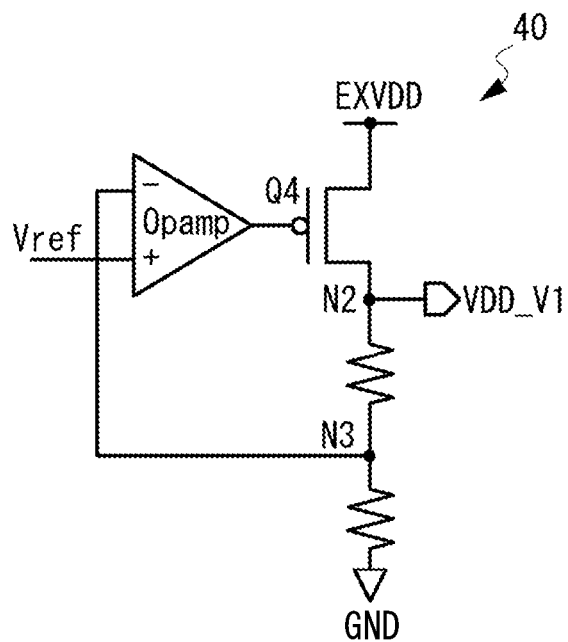

The INTVDD generating circuit 110 includes the previously described regulator 30 shown in FIG. 7A. The internal power supply voltage INTVDD generated by the regulator 30 is supplied to a logic circuit or other circuits of the flash memory. In addition, the VDD_V1 generating circuit 120 includes the previously described regulator 40 shown in FIG. 7B. The internal power supply voltage VDD_V1 generated by the regulator 40 is supplied to the V1_driving circuit 130 and is only used for charging the bit line.

Figure 9:
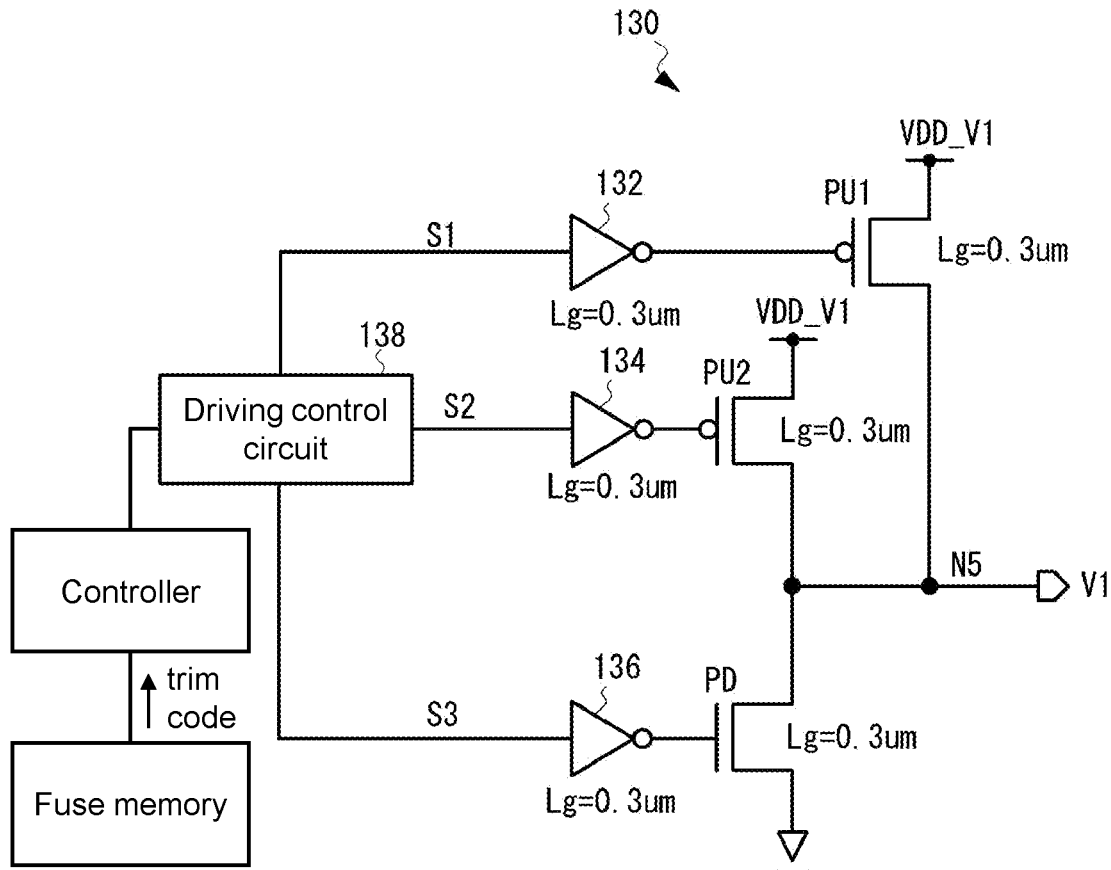
FIG. 9 is a diagram illustrating a structure of the V1_driving circuit according to an embodiment of the disclosure.

FIG. 9 illustrates an internal structure of the V1_driving circuit 130. The V1_driving circuit 130 includes: a P-type pull-up transistor PU1, a pull-up transistor PU2 connected in parallel between the internal power supply voltage VDD_V1 and an output node N5, an N-type pull-down transistor PD connected between the output node N5 and GND, an inverter 132, an inverter 134, and an inverter 136 with output terminals connected to each gate of the transistor PU1, the transistor PU2, and the transistor PD, and a driving control circuit 138 connected to input terminals of the inverter 132, the inverter 134, and the inverter 136.

Figure 2:
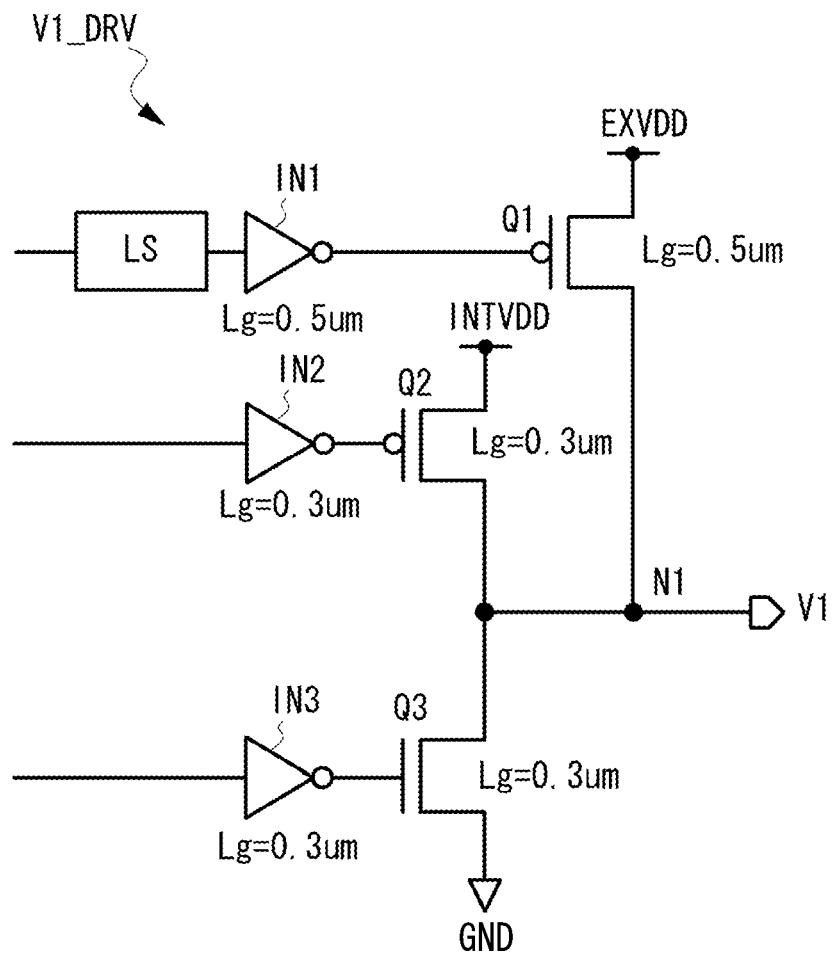
FIG. 2 is a diagram illustrating a driving circuit of a voltage used for charging a bit line in the related art.
Figure 3:
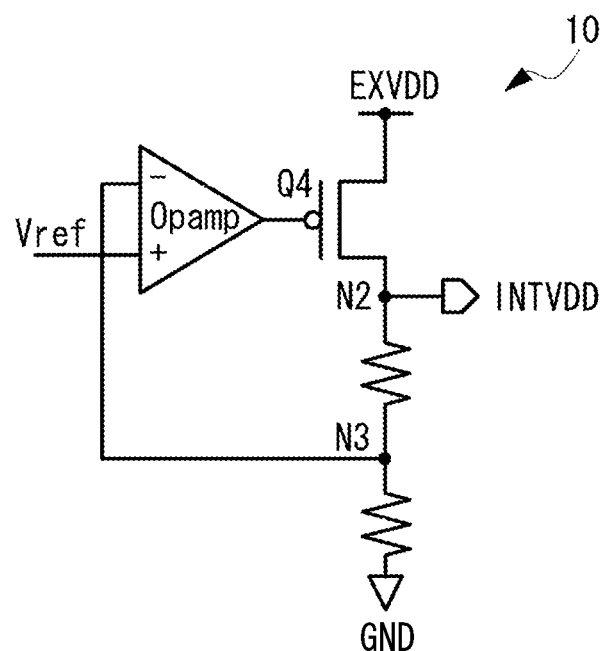
FIG. 3 is a diagram illustrating a regulator generating an internal power supply voltage.
Figure 4:
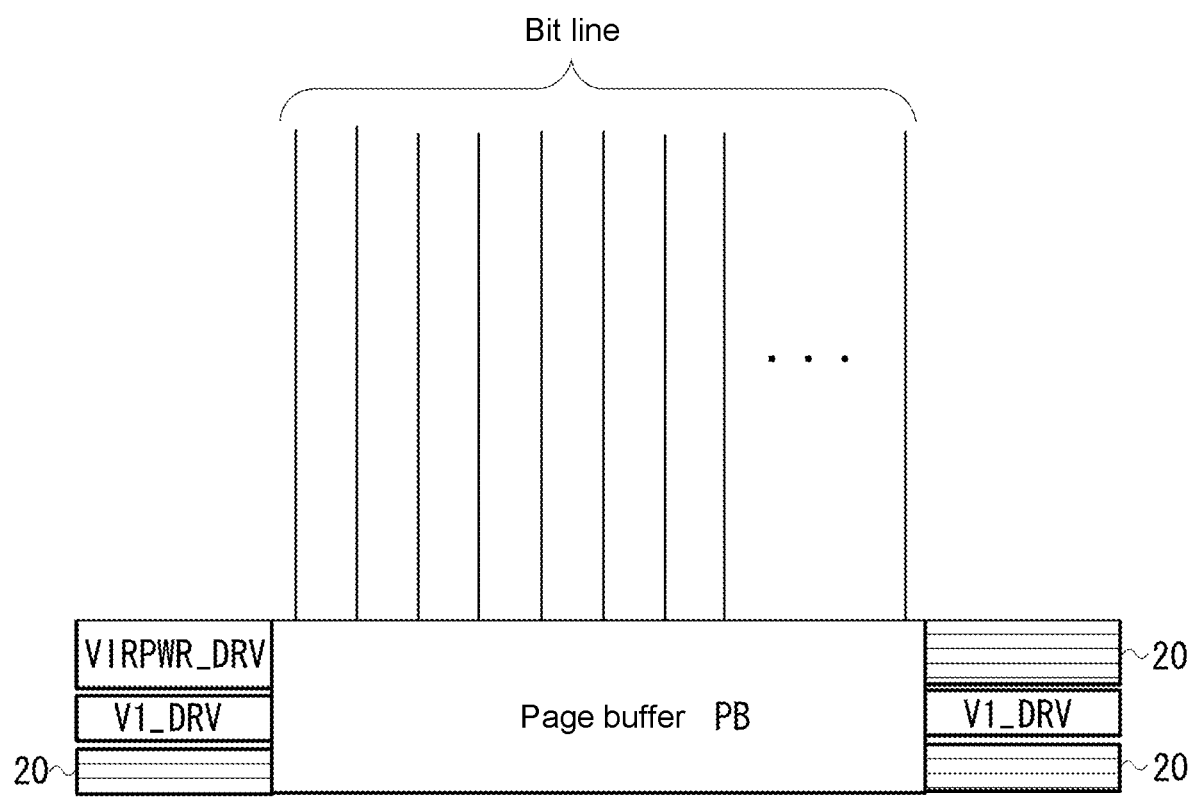
FIG. 4 is a diagram illustrating a layout example of a driving circuit disposed around the page buffer/readout circuit.
Figure 5:
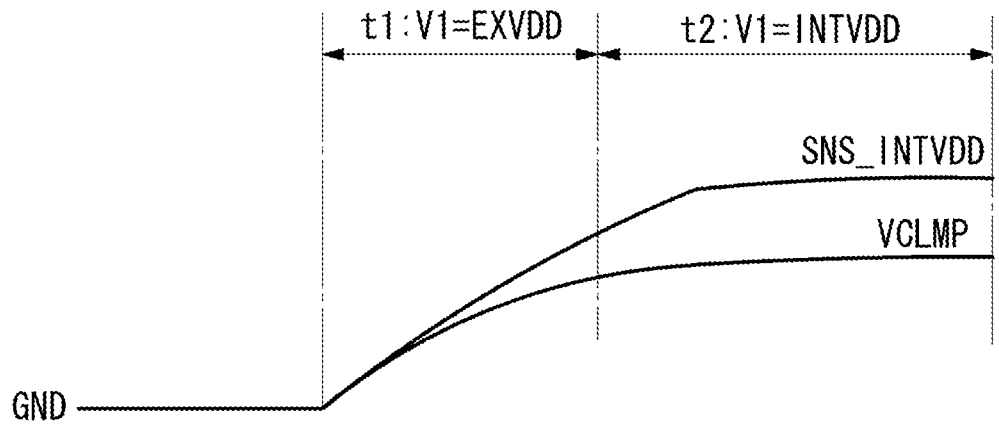
FIG. 5 is a graph illustrating a relationship between waveforms of a clamp voltage and an internal power supply voltage and operations of a V1_driving circuit when a bit line is charged.

The pull-up transistor PU1, the pull-up transistor PU2, the pull-down transistor PD, and PMOS/NMOS transistors constituting the inverter 132, the inverter 134, and the inverter 136 are all driven by the low voltage (1.8 V), so that it is no problem for small withstand voltages of the transistors, and gate lengths Lg of the transistors are all 0.3 μm. Comparatively, the pull-up transistor Q1 and the inverter IN1 shown in FIG. 2 and FIG. 6 are driven by the high voltage (3.3 V) of the external power supply voltage EXVDD, so that a gate length thereof is 0.5 μm, and a level shifter LS is also required. Moreover, power supply voltages on source sides of the pull-up transistor Q1 and the pull-up transistor Q2 are different, so that it is required to separate an N-type well in a layout design. Therefore, the circuit area of the V1_driving circuit 130 of the embodiment may be smaller than that of the driving circuit shown in FIG. 2 and FIG. 6 that uses the external power supply voltage EXVDD.

It should be noted that in the V1_driving circuit 130 of the embodiment, the driving capability of the pull-up transistor PU2 is configured to be stronger than the driving capability of the pull-up transistor PU1. Namely, a width/length ratio (a W/L ratio) of the pull-up transistor PU2 is configured to be larger than a W/L ratio of the pull-up transistor PU1. Therefore, a drain current flowed when the pull-up transistor PU2 is turned on is larger than a drain current flowed when the pull-up transistor PU1 is turned on.

The driving control circuit 138 is controlled by a controller or a state machine that is not illustrated, and outputs a driving signal S1, a driving signal S2, and a driving signal S3 to the inverter 132, the inverter 134, and the inverter 136 according to a time sequence for charging the bit line. The inverter 132, the inverter 134, and the inverter 136 output a high (H) level or low (L) level signal to the gates of the pull-up transistor PU1, the pull-up transistor PU2, and the pull-down transistor PD according to the driving signal S1, the driving signal S2, and the driving signal S3.

If the driving control circuit 138 outputs the H-level driving signal S1, the L-level driving signal S2, and the H-level driving signal S3 when charging the bit line, the pull-up transistor PU1 is turned on, the pull-up transistor PU2 is turned off, and the pull-down transistor PD is turned off, and the voltage V1 with weak driving capability is generated at the output node N5 (since only the weak pull-up transistor PU1 is turned on). Moreover, if the L-level driving signal S1, the H-level driving signal S2, and the H-level driving signal S3 are output, the pull-up transistor PU1 is turned off, the pull-up transistor PU2 is turned on, and the pull-down transistor PD is turned off, and the voltage V1 with moderate driving capability is generated at the output node N5 (since only the strong pull-up transistor PU2 is turned on). Alternatively, if the H-level driving signal S1, the H-level driving signal S2, and the H-level driving signal S3 are output, the pull-up transistor PU1 is turned on, the pull-up transistor PU2 is turned on, and the pull-down transistor PD is turned off, and the voltage V1 with strong driving capability is generated at the output node N5 (since the pull-up transistors PU1 and PU2 are all turned on). When the bit line is not charged, the driving control circuit 138 outputs the driving signal S1, the driving signal S2, and the driving signal S3 of the L-level to turn off the pull-up transistor PU1 and the pull-up transistor PU2, and turn on the pull-down transistor PD, so that the output node N5 becomes the GND level.

Figure 1:
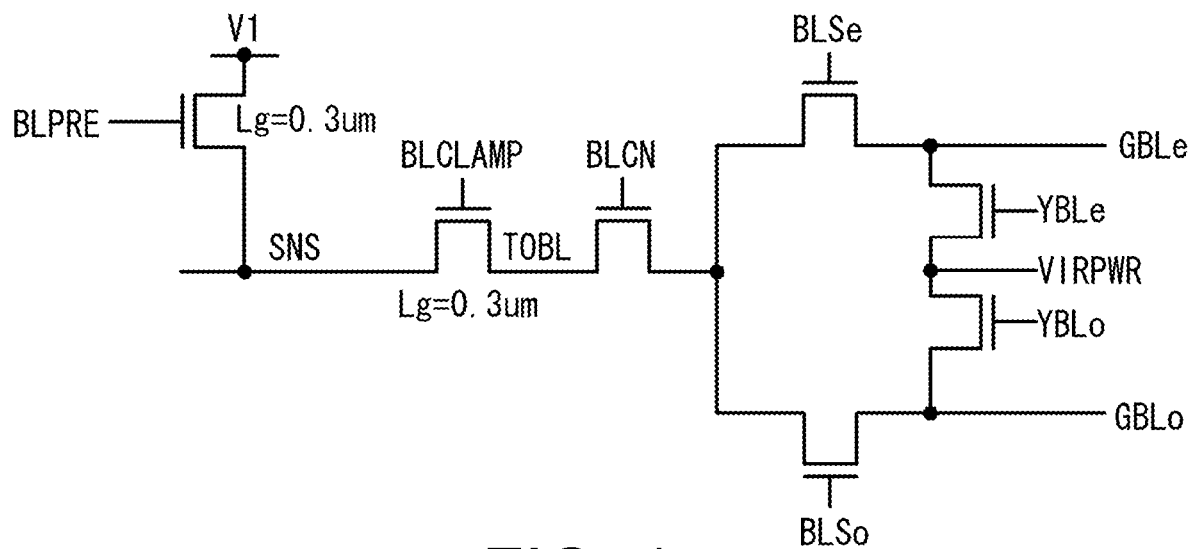
FIG. 1 is a diagram illustrating a part of a page buffer/readout circuit of a flash memory and a bit line selection circuit.

The voltage V1 generated at the output node N5 of the V1_driving circuit 130 is supplied to a drain of a pre-charging transistor of the page buffer/readout circuit shown in FIG. 1. Moreover, although not illustrated, the driving circuit of the virtual power supply VIRPWR connected to the bit line selection circuit is similar to the V1_driving circuit 130 shown in FIG. 9 in structure.

Figure 10:
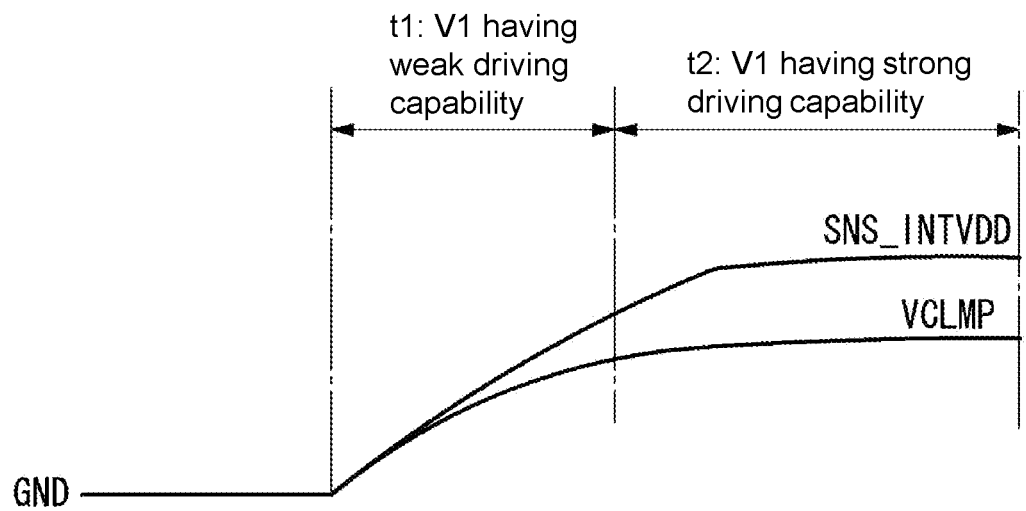
FIG. 10 is a graph illustrating a relationship between waveforms of a clamp voltage and an internal power supply voltage and operations of the V1_driving circuit when the bit line is charged according to an embodiment of the disclosure.

Next, the operation of the V1_driving circuit 130 when charging the bit line is described below. FIG. 10 illustrates a relationship between the driving capability of the V1_driving circuit and waveforms of a charging voltage SNS_INTVDD appeared at the readout node SNS and the clamp voltage VCLMP appeared at the node TOBL when the bit line is charged. As shown in FIG. 10, the driving control circuit 138 turns on the pull-up transistor PU1, turns off the pull-up transistor PU2, and turns off the pull-down transistor PD during a period t1 when initially charging the bit line, and uses the voltage V1 having the weak driving capacity to charge the bit line. During a next charging period t2, the driving control circuit 138 turns on the pull-up transistor PU1 and the pull-up transistor PU2, and turns off the pull-down transistor PD, and uses the voltage V1 having the strong driving capacity to charge the bit line.

During the initial charging period t1, the bit line is charged with the voltage V1 having the weak driving capability, so that the peak current during this period may be reduced. Namely, the voltage drop of the external power supply voltage EXVDD caused by the voltage drop of the internal power supply voltage VDD_V1 may be reduced, and the influence on the internal power supply voltage INTVDD may be suppressed. Moreover, even if the period t1 for charging the bit line with the voltage V1 having the weak driving capability is prolonged, since the internal power supply voltage is used for charging, the charging voltage SNS_INTVDD does not exceed the internal power supply voltage. Namely, no withstand voltage violation occurs in the transistor BLPRE or the transistor BLCLAMP designed in low voltage driving.

Moreover, the overall driving capability of the V1_driving circuit 130 of the embodiment may be set to be approximately the same as the driving capability of the V1_driving circuit of FIG. 2.

In this way, according to the embodiment, since the V1_driving circuit 130 does not use the external power supply voltage EXVDD, the pull-up transistor PU1 and the inverter 132 may become low voltage driving like other transistors, and since the level shifter is not used, the circuit area may be reduced compared to the existing driving circuit using the external power supply voltage. In addition, the pull-up transistor PU1 and the pull-up transistor PU2 have the same power supply voltage on the source sides. Therefore, the N-type well may be shared in the layout design, and the layout area may be reduced. Thus, the area around the page buffer may be effectively used. In addition, the V1_driving circuit 130 has a function of generating the voltage V1 with different driving capabilities, and by selectively switching the driving capabilities of the voltage V1, the peak current during charging of the bit line may be reduced.

Next, modifications of the disclosure are described below. Generally, in the flash memory, in order to suppress a deviation of a circuit operation caused by a process change, etc., a trim code (operation setting information) is stored in a fuse memory according to the process change. The trim code is stored in the fuse memory during a pre-shipment test. After the shipment, when the power of the flash memory is turned on, the controller reads the trim code from the fuse memory, and sets operation parameters of the circuits, etc., according to the trim code.

Therefore, in this embodiment, in order to adjust a deviation of the driving capability of the V1_driving circuit 130 corresponding to the process change, the controller controls the timing of the driving signals S1-S3 output by the driving control circuit 138 according to the trim code, so as to adjust the driving capabilities of the PMOS transistors PU1 and PU2, and generate the voltage V1 with different driving capabilities. In the embodiment, the gate lengths of the PMOS transistors PU1 and PU2 are the same, and the same internal power supply voltage VDD_V1 is set as a source power supply, so that the driving capabilities of the PMOS transistors PU1 and PU2 may be easily adjusted by using the trim code.

When the V1_driving circuit 130 has a deviation in driving capability due to a change in PVT, etc., in case of the deviation of fast charging (for example, a drain current of the pull-up transistor is large), the peak current may be reduced by prolonging the period t1 of charging the bit line with the voltage V1 having the weak driving capability as much as possible within a target time that allows charging the bit line. Moreover, in case of the deviation of slow charging, the period T2 of charging the bit line with the voltage V1 having the strong driving ability may be prolonged within the target time.

Moreover, when the flash memory has a function of detecting an operating temperature, the controller may adjust a timing that the driving control circuit 138 generates the voltage V1 with different driving capabilities according to the detected operating temperature. In this case, the relationship between the operating temperature and the deviation of the driving ability is set to be known through circuit analogy.

Moreover, in other embodiments, a plurality of P-type pull-up transistors having different gate widths may be provided in parallel between the internal power supply voltage VDD_V1 and the output node N5, and the most suitable pull-up transistor may be selected according to the trim code. For example, a first pull-up transistor with a gate width W1=40 μm, a second pull-up transistor with a gate width W2=80 μm, a third pull-up transistor with a gate width W2=120 μm, and a fourth pull-up transistor with a gate width W3=160 μm are prepared.

In an initial value, it is set that the first pull-up transistor and the third pull-up transistor are used to charge the bit line through the aforementioned method. When a change in PVT occurs, the second pull-up transistor and the fourth pull-up transistor are switched for charging according to the trim code. A switching method thereof is, for example, to use an electrical switching circuit to connect the pull-up transistor corresponding to the code with the voltage supply path, or achieve a permanent setting by fusing wires by means of laser, etc.

The preferred embodiments of the disclosure have been described in detail, but the disclosure is not limited to the specific embodiments, and various modifications may be made within the scope of the spirit of the disclosure described in the claims.

What is claimed is:

1. A voltage generating circuit, comprising:
a first circuit, generating a first internal power supply voltage by using an external power supply voltage; and
a second circuit, generating a charging voltage at an output node for charging a bit line by using the first internal power supply voltage and comprising:
a first generating circuit, generating a charging voltage having a first driving capability;
a second generating circuit, generating a charging voltage having a second driving capability greater than the first driving capability; and
a control component, controlling the charging voltages generated by the first generating circuit and the second generating circuit,
wherein when charging the bit line, the second circuit first uses the charging voltage having the first driving capability to charge the bit line, and then uses the charging voltage having the second driving capability to charge the bit line.

2. The voltage generating circuit as claimed in claim 1, wherein the control component generates the charging voltage having the first driving capability during a first charging period of the bit line by using the first generating circuit and generates the charging voltage having the second driving capability during a second charging period of the bit line by using the second generating circuit.

3. The voltage generating circuit as claimed in claim 2, wherein the control component generates the charging voltage having the first driving capability and the charging voltage having the second driving capability during the second charging period by using the first generating circuit and the second generating circuit.

4. The voltage generating circuit as claimed in claim 1, further comprising:
a third circuit, independent of the first circuit and generating a second internal power supply voltage by using the external power supply voltage, wherein the third circuit supplies the second internal power supply voltage to another circuit different from charging of the bit line.

5. The voltage generating circuit as claimed in claim 1, wherein the first generating circuit comprises a first pull-up transistor between the first internal power supply voltage and the output node, the second generating circuit comprises a second pull-up transistor between the first internal power supply voltage and the output node, and a width/length ratio of the second pull-up transistor is greater than a width/length ratio of the first pull-up transistor.

6. The voltage generating circuit as claimed in claim 5, wherein a gate length of the first pull-up transistor is equal to a gate length of the second pull-up transistor.

7. The voltage generating circuit as claimed in claim 5, wherein the second circuit further comprises a pull-down transistor connected to the first pull-up transistor and the second pull-up transistor in series, and the control component outputs a driving control signal for driving the first pull-up transistor, the second pull-up transistor, and the pull-down transistor.

8. The voltage generating circuit as claimed in claim 1, wherein the control component adjusts a ratio between the charging voltage having the first driving capability and the charging voltage having the second driving capability according to a trim code.

9. The voltage generating circuit as claimed in claim 8, wherein the trim code is set according to a change of a manufacturing process.

10. The voltage generating circuit as claimed in claim 1, wherein the charging voltage generated by the second circuit is supplied to a page buffer/readout circuit via a transistor operated by the internal power supply voltage.

11. A semiconductor storage device, comprising:
a voltage generating circuit comprising:
a first circuit, generating a first internal power supply voltage by using an external power supply voltage; and
a second circuit, generating a charging voltage at an output node for charging a bit line by using the first internal power supply voltage and comprising:
a first generating circuit, generating a charging voltage having a first driving capability;
a second generating circuit, generating a charging voltage having a second driving capability greater than the first driving capability; and a control component, controlling the charging voltages generated by the first generating circuit and the second generating circuit, wherein when charging the bit line, the second circuit first uses the charging voltage having the first driving capability to charge the bit line, and then uses the charging voltage having the second driving capability to charge the bit line; and a page buffer/readout circuit connected to the voltage generating circuit, wherein the second circuit is disposed around the page buffer/readout circuit.

12. A method for charging a bit line of a semiconductor storage device, comprising:

generating an internal power supply voltage only used for charging the bit line from an external power supply voltage;

charging the bit line by using a charging voltage having a first driving capability generated from the internal power supply voltage during a first charging period of the bit line; and charging the bit line by using a charging voltage having a second driving capability greater than the first driving capability generated from the internal power supply voltage during a second charging period after the first charging period.

13. The method for charging the bit line of the semiconductor storage device as claimed in claim 12, further comprising: charging the bit line by using the charging voltage having the first driving capability and the charging voltage having the second driving capability during the second charging period.

* * * * *